United States Patent [19]
Chan et al.

[11] Patent Number: 5,991,158
[45] Date of Patent: Nov. 23, 1999

[54] SLOT FOR MECHANICALLY DETECTING THE PRESENCE OF A COMPUTER CARD

[75] Inventors: Richard Chan; Stuart Hayes, both of Austin, Tex.

[73] Assignee: Dell USA, L.P., Round Rock, Tex.

[21] Appl. No.: 08/979,045

[22] Filed: Nov. 26, 1997

Related U.S. Application Data

[63] Continuation of application No. 08/449,638, May 24, 1995, abandoned.

[51] Int. Cl.$^6$ .............................. H05K 1/14; H05K 1/00; H01R 23/70
[52] U.S. Cl. .......................... 361/736; 361/748; 710/102; 439/630
[58] Field of Search ........................ 364/708.1; 361/684, 361/736, 748, 783; 376/101; 395/281, 282, 283; 710/101, 102, 103; 439/260, 630, 637

[56] References Cited

U.S. PATENT DOCUMENTS

| | | | |
|---|---|---|---|
| 3,795,888 | 3/1974 | Nardo et al. | 439/630 |
| 3,878,344 | 4/1975 | Lockard | 200/6 |
| 4,106,841 | 8/1978 | Vladic | 439/188 |
| 4,480,884 | 11/1984 | Babuka et al. | 339/17 |
| 4,553,192 | 11/1985 | Babuka et al. | 361/395 |
| 4,675,769 | 6/1987 | Marshall et al. | 361/1 |
| 4,744,006 | 5/1988 | Duffield | 361/413 |
| 4,858,162 | 8/1989 | Kieffer et al. | 364/708 |
| 4,891,023 | 1/1990 | Lopata | 439/637 |
| 5,055,061 | 10/1991 | Lichtenwalter | 439/377 |
| 5,116,237 | 5/1992 | Loewen | 439/326 |
| 5,162,675 | 11/1992 | Olsen et al. | 307/465 |
| 5,202,551 | 4/1993 | Parrer et al. | 235/486 |
| 5,207,598 | 5/1993 | Yamada et al. | 439/636 |
| 5,308,248 | 5/1994 | Davidge et al. | 439/59 |
| 5,427,534 | 6/1995 | Spickler et al. | 439/64 |
| 5,501,608 | 3/1996 | Scheer et al. | 439/218 |
| 5,525,795 | 6/1996 | MacGregor et al. | 250/222.1 |
| 5,544,006 | 8/1996 | Radloff et al. | 361/683 |
| 5,568,610 | 10/1996 | Brown | 710/102 |
| 5,586,270 | 12/1996 | Rotier et al. | 395/282 |
| 5,612,634 | 3/1997 | MacKenna | 326/62 |
| 5,636,347 | 6/1997 | Muchnick et al. | 395/283 |

FOREIGN PATENT DOCUMENTS

| | | |
|---|---|---|
| 0562295A1 | 2/1993 | European Pat. Off. . |
| 0655692A2 | 11/1994 | European Pat. Off. . |

*Primary Examiner*—Emmanuel L. Moise
*Attorney, Agent, or Firm*—Skjerven, Morrill, MacPherson, Franklin & Friel, L.L.P.; William W. Holloway

[57] ABSTRACT

A switch is disclosed for indicating that a computer card is installed in an expansion slot of a computer. A conductive strip attaches to an end wall of the slot and deforms when a computer card is installed. A conductive contact is provided in the wall of the slot to complete an electrical connection when the conductive strip is deformed. The strip connects electrically to a conductor that is passively driven high by a voltage source and pull-up resistor. The contact connects electrically to ground, so that when the computer card causes the strip to touch the contact, the voltage on conductor is driven low, providing an indication to associated circuitry that a card is present in the slot. A pair of switches may be used to provide repetitive signals indicating a card is present. If only one switch is closed, the computer may indicate to the user that a card has been installed improperly, or contaminants are present in the slot.

20 Claims, 3 Drawing Sheets

SLOT FOR MECHANICALLY DETECTING THE PRESENCE OF A COMPUTER CARD

This application is a continuation of application Ser. No. 08/449,638, filed May 24, 1995, now abandoned.

BACKGROUND OF THE INVENTION

The present invention relates generally to a system for supporting peripheral computer cards and other optional external devices in a personal computer (PC) system More particularly, the present invention relates to a system which monitors the presence of peripheral computer cards in a PC system. Still more particularly, the present invention relates to a specially modified slot which detects whether peripheral computer cards have been installed.

The components provided in a PC system typically may comprise a combination of fixed, internal devices, and peripheral external devices that may be added to the PC system to increase the computing power or to add features not included as part of the fixed PC system supplied by the manufacturer. The PC system typically includes a motherboard on which most of the fixed internal circuitry of the PC is mounted. The circuitry typically is fabricated as discrete integrated circuits (IC's) mounted to conductive pads on the motherboard. The various IC's are connected together electrically by various electrical buses, such as for, example, a host bus, which connects the central processing unit to the memory controller and other critical components. As one skilled in the art will understand, the system bus can comprise any suitable bus system, such as an ISA, EISA, MCA, PCI or other suitable system bus.

The motherboard also typically includes sockets or external connections for receiving peripheral cards or components to supplement the circuitry provided on the motherboard. As shown in the computer 5 of FIG. 1, a riser board 10 may connect to the motherboard 15. The motherboard 15 typically is positioned horizontally in the computer case 20. The riser board 10 extends vertically from the motherboard 15, and includes expansion slots 11, 12, 13, 14. As one skilled in the art will understand, additional or fewer expansion slots may be provided by the computer manufacturer, as desired. The expansion slots are displaced vertically on the riser card 10, enabling computer cards to be inserted horizontally into the slots. In FIG. 1, an expansion card or board 25 is shown inserted into slot 12.

As one skilled in the art will understand, it is necessary to remove a portion of the computer casing 20 to access the expansion slots 11, 12, 13, 14, and to install computer cards. After the card 25 is installed, the casing cover is closed. Typically, a screwdriver is required to remove and close the casing cover of the computer. Consequently, it is not possible to confirm visually that a card 25 is installed in an expansion slot unless a portion of the casing cover 20 is removed from the computer 5, which normally requires tools, and may also require that the computer be repositioned and/or disconnected from peripheral equipment to obtain access to the removable casing cover.

Presently, conventional computer systems determine if a card is present in an expansion slot electrically, by driving signals through the electrical connectors 8 in the slot to connectors 9 on the computer card. If the card responds by transmitting signals back through the electrical connectors 8 and 9 to appropriate circuitry on the mother board, then the presence of the card is conferred. A problem arises, however, if the computer card is malfunctioning, and does not respond to signals from the computer. In that event, the only way to detect the presence of the card in the expansion slot is to visually inspect the slot by removing the computer casing cover. Similarly, if no card is present in the expansion slot (as may happen, for example, if the user confuses the slot in which the card was installed), then this fact may only be confirmed by removing the casing cover.

It would be advantageous if an expansion slot was designed with a system for mechanically detecting whether a computer card was installed in a particular slot so that the presence of the card could be confirmed even if the card was malfunctioning Despite the benefit of such a design, no such design is available commercially.

SUMMARY OF THE INVENTION

The present invention solves the shortcomings and deficiencies of the prior art by providing a computer system that autoratically determines whether optional peripheral cards are present in a PC system The present invention preferably is implemented with a pair of conductive strips or springs mounted at respective ends of the expansion slot. The springs are positioned so that the insertion of a computer card causes the spring to change its position, closing a contact.

In the preferred embodiment, the conductive strip connects electrically to a conductor that is passively maintained at a high voltage level. The underlying contact connects electrically to ground. When the computer card causes the strip to touch the contact, the voltage level on the conductor goes to a low voltage level as current flows to ground through the strip and contact. The presence of a low voltage level on the conductor therefore provides a signal to an input/output chip or other device that a card is present in the expansion slot. The use of two strips in the preferred embodiment provides system redundancy, insuring that the presence of a card is indicated only if both strips are in contact with the underlying contacts. In addition, the use of two conductive strips permits diagnostic features in the computer, including improper card installation, or the presence of foreign matter in the slot.

BRIEF DESCRIPTION OF THE DRAWINGS

For a more detailed description of the preferred embodiment of the present invention, reference will now be made to the accompanying drawings, wherein.

Figure 1:
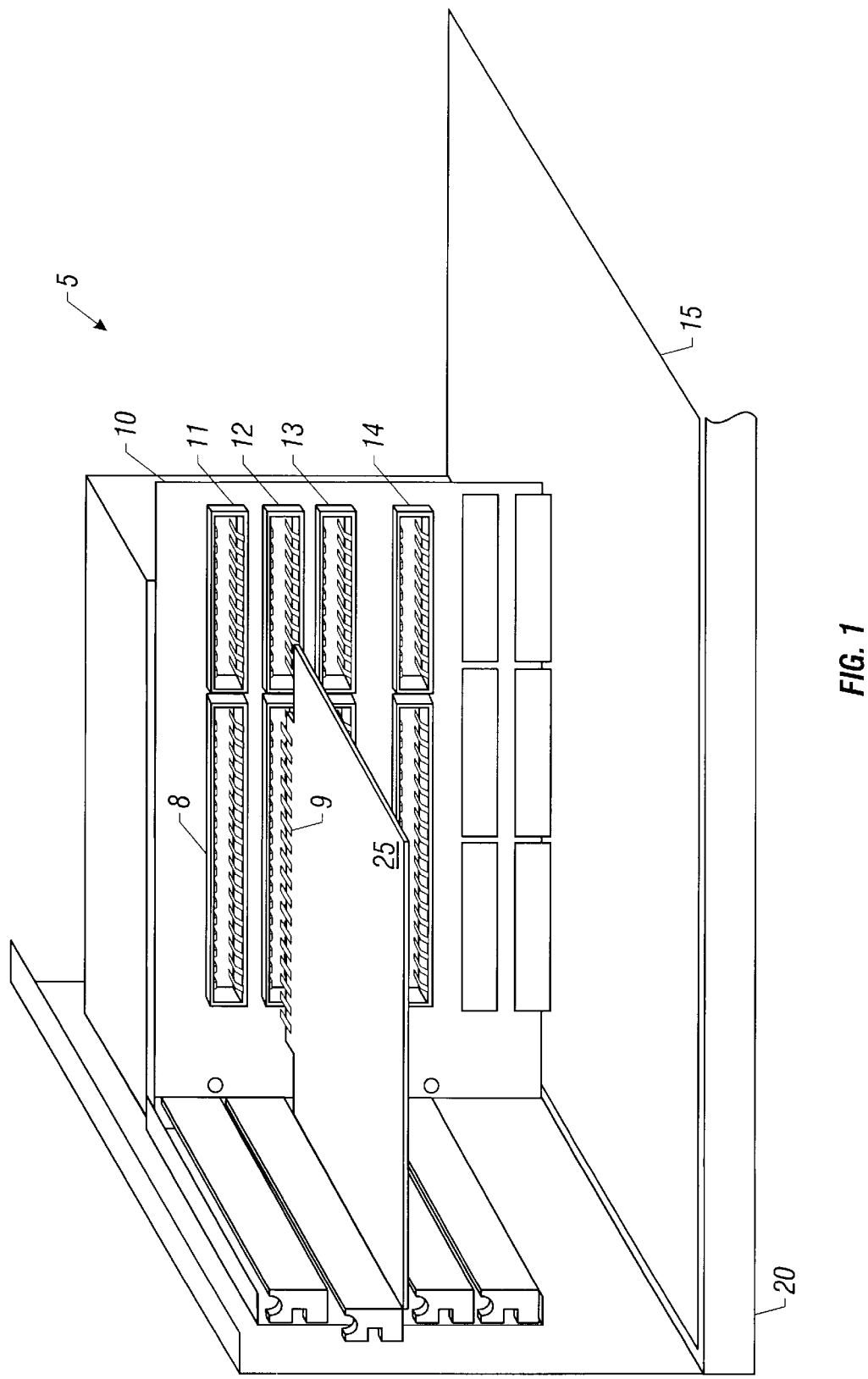
FIG. 1 is a perspective view of a portion of a conventional computer system with the casing cover removed, showing a plurality of expansion slots.

While the present invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. In particular, the present invention details a two specific configurations that may be used to implement the present invention. One skilled in the art will understand that a myriad of different configurations can be used in this invention, without deviating from the teachings which follow.

DETAILED DESCRIPTION OF THE PREFERRED EMBODIMENT

As shown in FIG. 1, a computer system 5 typically includes a riser card 10, or some other equivalent device or structure, on which expansion slots 11, 12, 13, 14 are provided. Additional or fewer expansion slots may be provided as desired by the computer manufacturer. Various expansion cards can be mounted in the slots to expand the capabilities of the computer as supplied by the manufacturer. Some common expansion cards that are commonly used are modems cards, networks cards and SCSI cards. Many other expansion cards also are available, as will be understood by one skilled in this art.

Figure 2:
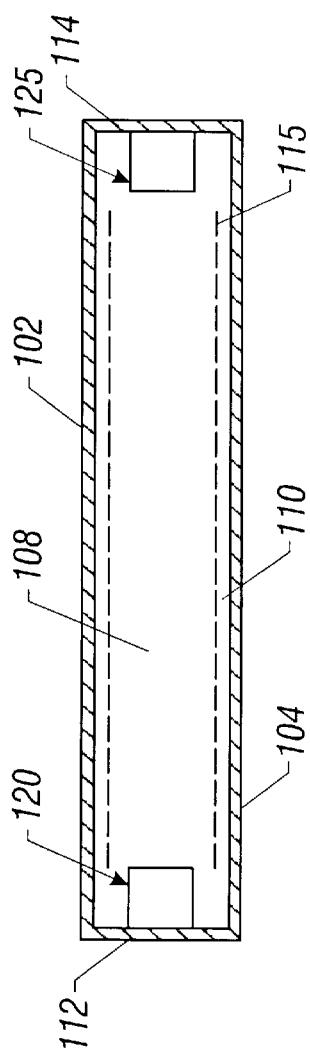
FIG. 2 shows a top elevation in cross-section of an expansion slot for a computer system constructed in accordance with an exemplary embodiment.
Figure 3:
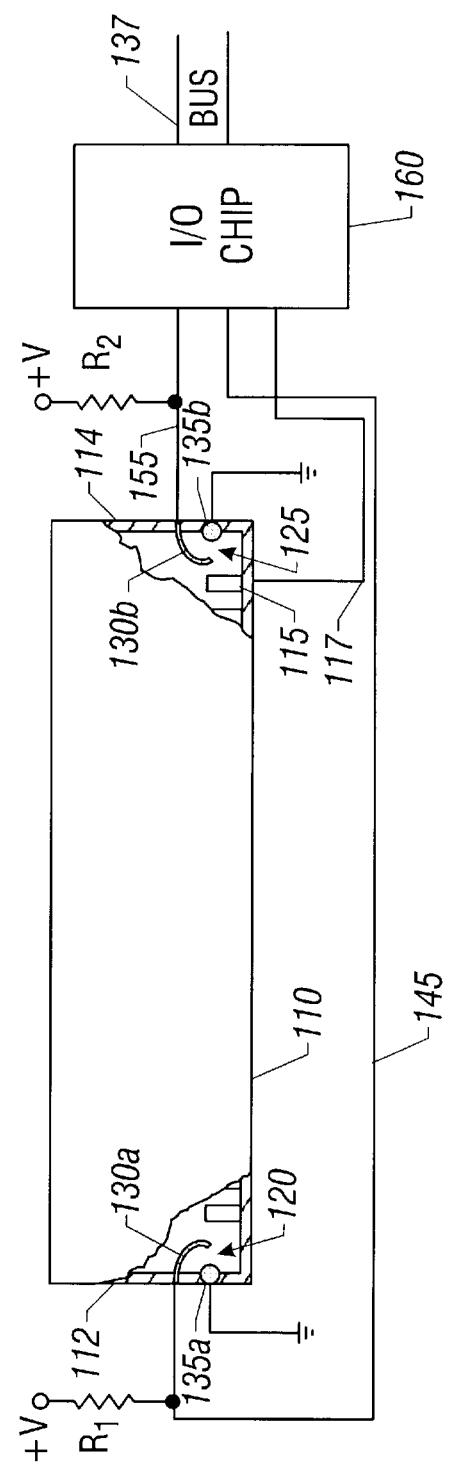
FIG. 3 shows a side elevation, partially cut away, of the slot according to the embodiment of FIG. 1.

The present invention now will be described with reference to FIGS. 2 and 3. FIGS. 2 and 3 show a single expansion slot 110 for a computer system for purposes of illustration. More than one expansion slot may be available in the computer system, as shown in FIG. 1. In accordance with normal convention, the expansion slot has an aperture 108 in which cards are inserted. The slot typically includes side walls 102, 104 and end walls 112, 114 for supporting the card once it is inserted in aperture 108. A plurality of electrical connectors 115 preferably are positioned along the interior periphery of the slot 110 for mating electrically with edge connectors on the computer card. According to the exemplary embodiment of FIGS. 2 and 3, the expansion slot 110 includes a pair of switches 120, 125 which close when a computer card is inserted into the expansion slot 110.

Figure 4:
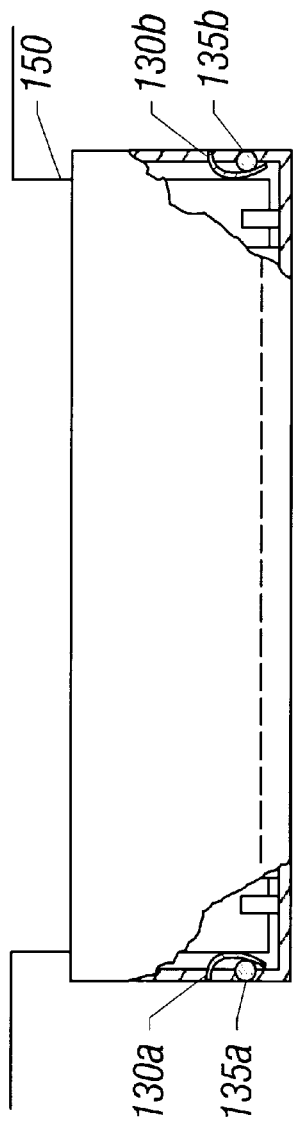
FIG. 4 shows the slot of FIG. 3 with a computer card installed.

Referring now to FIGS. 3 and 4, the switches 120, 125 preferably comprise a conductive strip or spring 130a, 130b, and an associated contact 135a, 135b. The conductive strip 130a preferably mounts at one end to the end wall 112 of slot 110, while conductive strip 130b mounts to end wall 114. Conductive strips 130a and 130b may comprise any suitable electrically conductive material which has the capability of deforming to touch the associated contact 135a, 135b when a card 150 is inserted in slot 110 (as shown in FIG. 4), and which will return to substantially its original shape once the card is removed from the slot 110 (as shown in FIG. 3). An example of a suitable strip would be a leaf spring, although the present invention should not be construed as limited to such a structure.

Contact 135a attaches to, or is embedded in, end wall 112. Similarly, contact 135b attaches to or is embedded in end wall 114. Contacts 135a and 135b preferably comprise a conductive pad or bead suitable formed in end walls 112, 114, respectively. Contacts 135a and 135b may also comprise a metal strip or any other suitable structure for contacting conductive strip 130a, 130b, respectively.

Referring again to FIG. 3, the conductive strip 130a and associated contact 135a preferably form part of an electrical circuit to indicate whether a computer card is present in the slot 110. Similarly, conductive strip 130b and contact 135b form a second electrical circuit for providing a second indication of the presence of a computer card in slot 110. As shown in FIG. 4, the contacts 135a and 135b both connect electrically to ground. Conductive strip 130a connects electrically to conductor 145, which preferably is connected to an input terminal of an input/output (I/O) chip 160. Conductor 145 also preferably connects to a voltage source V, through a pull-up resistor $R_1$. Similarly, conductive strip 130b connects electrically to a conductor 155, which also connects electrically to an input terminal of I/O chip 160. Conductor 155 also preferably connects to a voltage source V, through a pull-up resistor $R_2$.

The I/O chip 160 may comprise a standard buffer circuit for connecting to the slot connectors 115 through a conductor 117. Each of the connectors 115 may be connected to chip 160 in simirr fashion. As will be understood by one skilled in the art, chip 160 includes a plurality of drivers (not shown) for driving signals from connectors 115 onto bus 137, and for driving signals from bus 137 onto conductors 117. In similar fashion, signals from conductors 145, 155 are driven onto bus 137. As one skilled in the art will understand, conductors 145, 155 may alternatively connect to a controller, register, or other device configured to monitor the presence of computer cards.

Because of the connection to voltage source V, conductors 145 and 155 are passively maintained at voltage level V, which in binary logic represents a value of "1". When card 150 is inserted into slot 110, strip 130a connects electrically to contact 135a, causing the voltage on conductor 145 to drop to approximately zero volts, which in binary logic represents a value of "0". Simlarly, the voltage on conductor 155 varies between 0 and V volts, depending upon whether a card is present in slot 110. Consequently, when I/O chip receives a digital "0" on conductors 145, 155, then a computer card is indicated as present in slot 110. The I/O chip may AND together the outputs on conductors 145, 155, or may provide both signals to other components for further diagnostics. For example, if only one of the conductors is driven low while the other remains at a high voltage level the computer system may indicate to the user that a card has been installed improperly, or foreign matter may be present in the slot 110.

The present invention is susceptible to numerous variations without departing from the principles disclosed herein. For example, instead of driving conductors 145, 155 low when a card is inserted in slot 110, the circuitry of FIG. 3 may be modified to drive these conductors high. In addition, instead of providing two discrete signals indicative of the presence of a card, strips 130a and 130b and contacts 135a and 135b may be provided in the same circuit to provide a single indication of a card being present in slot 110. Other modifications and variations will be apparent to one skilled in the art.

Figure 5:
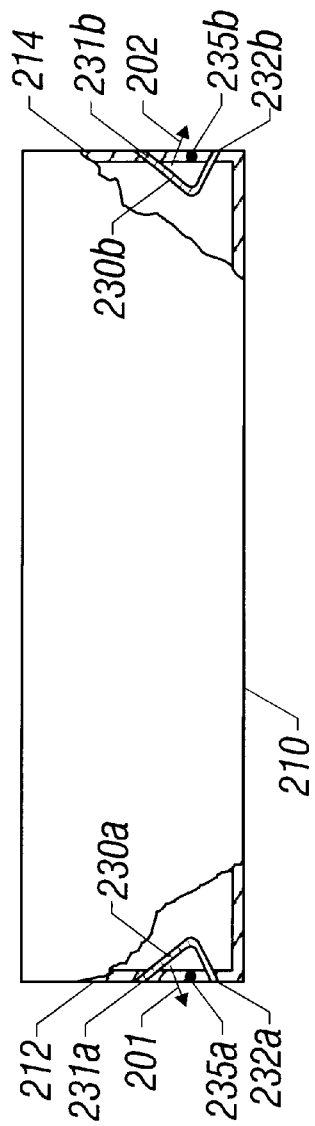
FIG. 5 shows a side elevation, partially cut away of an expansion slot for a computer system constructed in accordance with an alternative embodiment.

As shown in FIG. 5, the manner in which the contact is formed between the strip and contacts also may be varied as desired. For example, according to the alternative embodiment of FIG. 5, the conductive strips may pivot instead of deforming when a computer card is inserted in the slot. In FIG. 5, slot 210 includes conductive strips 230a, 230b that attach at an upper end 231a, 231b to end walls 212, 214, respectively. In this embodiment, a recess is provided in walls 212, 214 for receiving the lower end 232a, 232b of strips 230a, 230b, respectively. When a card is inserted in slot 210, strips 230a, 230b pivot about the upper end 231a, 231b as shown by arrows 201, 202, so that lower ends 232a, 232b are forced in the recess in walls 212, 214, respectively. As the strip 230a, 230b pivots, it eventually contacts the embedded contact 235a, 235b, indicating a card is present in the slot 210.

While a preferred embodiment of the invention has been shown and described, modifications thereof can be made by one skilled in the art without departing from the spirit of the invention.

I claim:

1. A computer with an expansion slot for receiving a computer card, said expansion slot comprising:
   a conductive strip positioned in a path of said computer card when said expansion slot receives said computer card;
   an electrical contact positioned adjacent said conductive strip;
   wherein said conductive strip is forced to change position and touches the electrical contact to indicate to the computer when the computer card is inserted into said slot.

2. A computer as in claim 1, wherein said conductive strip is deformable, and is forced to deform when the card is inserted into said slot.

3. A computer as in claim 1, wherein said conductive strip attaches to a wall of said slot.

4. A computer as in claim 3, wherein said electrical contact attaches to said wall.

5. A computer as in claim 4, wherein said conductive strip connects electrically to an electrical conductor, and said electrical contact connects electrically to ground.

6. A computer as in claim 5, wherein said electrical conductor connects to a voltage source through a pull-up resistor.

7. A computer as in claim 6, wherein said expansion slot includes electrical conductors for mating electrically with connectors on said card.

8. A computer as in claim 7, further comprising an input/output chip connected electrically to said electrical connectors and to said electrical conductor.

9. A computer as in claim 8, wherein said input/output chip connects electrically to a bus.

10. A computer as in claim 4, wherein an end of said strip attaches to said end wall, and said strip pivots about said end when the card is inserted in said slot.

11. A computer as in claim 1, further comprising;
    a second conductive strip positioned in said expansion slot;
    a second electrical contact positioned adjacent said second conductive strip;
    wherein said second conductive strip touches the second electrical contact when the computer card is inserted into said slot.

12. An expansion slot for a computer, said expansion slot including first and second walls, and an aperture for receiving a computer card, comprising:
    a first conductive strip attached to the first wall;
    a first electrical contact embedded in the first wall;
    a second conductive strip attached to the second wall;
    a second electrical contact embedded in the second wall;
    wherein
    said first conductive strip chances from a first position to a second position responsive to a computer card being inserted into said expansion slot, said first conductive strip touching said first electrical contact while in said second position to indicate to the computer that the computer card is positioned in said slot; and
    said second conductive strip chances from a third position to a fourth position responsive to a computer card being inserted into said expansion slot, said second conductive stir touching said second electrical contact while in said fourth position to indicate to the computer that the computer card is positioned in said slot.

13. A slot as in claim 12, wherein the first conductive strip connects electrically to a first conductor, and said second conductive strip connects electrically to a second electrical conductor, and wherein both said first and said second conductors are passively maintained at a high voltage level.

14. A slot as in claim 13, wherein said first and said second electrical contacts connect to ground.

15. A slot as in claim 14, wherein said first and second electrical conductors are driven to a low voltage level when said first and second conductive strips touch said first and second electrical contacts, respectively.

16. A slot as in claim 12, wherein said first and second conductive strips comprise springs.

17. A system for detecting the presence of a computer card in a slot, comprising:
    a plurality of electrical connectors in said slot for connecting electrically to edge connectors on said card;
    a switch in said slot, said switch including
        a conductive spring positioned such that said spring changes position from a first position to a second position when the card is inserted into said slot;
        an electrical contact positioned adjacent said conductive spring;
        wherein said spring touches said electrical contact when said spring changes to the second position when the card is inserted into said slot, said switch closing a circuit to generate a signal when said conductive spring is in said second position, said signal indicating that a computer card is present in said slot;
    an electrical conductor coupled to said switch; and
    an input/output chip coupled to said electrical conductor and to said plurality of electrical connectors in said slot.

18. A system as in claim 17, further comprising a bus connected to said input/output chip.

19. A system as in claim 17, further comprising a voltage source connected to said electrical conductor through a pull-up resistor.

20. A system as in claim 19, further comprising an electrical ground connected to said electrical contact.

* * * * *